United States Patent
Cowles et al.

(10) Patent No.: US 11,069,393 B2
(45) Date of Patent: Jul. 20, 2021

(54) APPARATUSES AND METHODS FOR CONTROLLING STEAL RATES

(71) Applicant: Micron Technology, Inc., Boise, ID (US)

(72) Inventors: Timothy B. Cowles, Boise, ID (US); Jiyun Li, Boise, ID (US); Beau D. Barry, Boise, ID (US); Matthew D. Jenkinson, Boise, ID (US); Nathaniel J. Meier, Boise, ID (US); Michael A. Shore, Boise, ID (US); Adam J. Grenzebach, Boise, ID (US); Dennis G. Montierth, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/431,641

(22) Filed: Jun. 4, 2019

(65) Prior Publication Data

US 2020/0388325 A1    Dec. 10, 2020

(51) Int. Cl.
*G11C 7/00*     (2006.01)
*G11C 11/406*   (2006.01)
*G11C 11/408*   (2006.01)

(52) U.S. Cl.
CPC ..... *G11C 11/40611* (2013.01); *G11C 11/4085* (2013.01); *G11C 11/4087* (2013.01); *G11C 11/40618* (2013.01)

(58) Field of Classification Search
CPC ........ G11C 11/40611; G11C 11/40618; G11C 11/4085; G11C 11/4087
See application file for complete search history.

(56) References Cited

U.S. PATENT DOCUMENTS

| | | |
|---|---|---|
| 5,299,159 A | 3/1994 | Balistreri et al. |
| 5,654,929 A | 8/1997 | Mote, Jr. |
| 5,699,297 A | 12/1997 | Yamazaki et al. |
| 5,933,377 A | 8/1999 | Hidaka |
| 5,943,283 A | 8/1999 | Wong et al. |
| 5,956,288 A | 9/1999 | Bermingham et al. |
| 5,959,923 A | 9/1999 | Matteson et al. |

(Continued)

FOREIGN PATENT DOCUMENTS

| | | |
|---|---|---|
| CN | 101038785 A | 9/2007 |
| CN | 101067972 A | 11/2007 |

(Continued)

OTHER PUBLICATIONS

U.S. Appl. No. 15/881,256 entitled 'Apparatuses and Methods for Detecting a Row Hammer Attack With a Bandpass Filter' filed Jan. 26, 2018.

(Continued)

*Primary Examiner* — Toan K Le
(74) *Attorney, Agent, or Firm* — Dorsey & Whitney LLP

(57) ABSTRACT

An apparatus may include a refresh control circuit with multiple timing circuits. The timing circuits may be used to control steal rates, e.g., the rate of refresh time slots dedicated to healing victim word lines of row hammers. The timing circuits may be controlled to allow independent adjustment of the steal rates for different victim word lines. Thus, different victim word lines may be refreshed at different rates and the different rates may be independent of one another.

20 Claims, 6 Drawing Sheets

(56) References Cited

U.S. PATENT DOCUMENTS

| | | |
|---|---|---|
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,306,721 B1 | 10/2001 | Teo et al. |
| 6,310,806 B1 | 10/2001 | Higashi et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,830,742 B2 | 11/2010 | Han |
| 8,174,921 B2 | 5/2012 | Kim et al. |
| 8,400,805 B2 | 3/2013 | Yoko |
| 8,572,423 B1 | 10/2013 | Isachar et al. |
| 8,625,360 B2 | 1/2014 | Iwamoto et al. |
| 8,681,578 B2 | 3/2014 | Narui |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,406,358 B1 | 8/2016 | Lee |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,653,139 B1 | 5/2017 | Park |
| 9,672,889 B2 | 6/2017 | Lee et al. |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,490,250 B1 | 11/2019 | Ito et al. |
| 10,510,396 B1 | 12/2019 | Notani et al. |
| 10,572,377 B1 * | 2/2020 | Zhang .................. H03K 19/20 |
| 10,573,370 B2 | 2/2020 | Ito et al. |
| 10,685,696 B2 | 6/2020 | Brown et al. |
| 10,790,005 B1 | 9/2020 | He et al. |
| 10,943,636 B1 | 3/2021 | Wu et al. |
| 10,957,377 B2 | 3/2021 | Noguchi |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De Paor et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0028068 A1 | 2/2007 | Golding et al. |
| 2007/0030746 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0266990 A1 | 10/2008 | Loeffler |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |

(56) References Cited

U.S. PATENT DOCUMENTS

| | | |
|---|---|---|
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0092508 A1 | 4/2015 | Bains |
| 2015/0109871 A1 | 4/2015 | Bains et al. |
| 2015/0170728 A1 | 6/2015 | Jung et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1* | 3/2016 | Liu .................... G09G 5/18 345/212 |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0186481 A1 | 6/2017 | Oh et al. |
| 2017/0213586 A1 | 7/2017 | Kang et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0047110 A1 | 2/2018 | Blackman et al. |
| 2018/0061476 A1 | 3/2018 | Kim |
| 2018/0075927 A1 | 3/2018 | Jeong et al. |
| 2018/0096719 A1 | 4/2018 | Tomishima et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1* | 8/2018 | Wolff ................ G11C 11/40611 |
| 2018/0226119 A1 | 8/2018 | Kim et al. |
| 2018/0233197 A1 | 8/2018 | Laurent |
| 2018/0240511 A1* | 8/2018 | Yoshida ............ G11C 11/40611 |
| 2018/0247676 A1 | 8/2018 | Kim et al. |
| 2018/0254078 A1* | 9/2018 | We ........................ G11C 11/406 |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2019/0013059 A1 | 1/2019 | Akamatsu |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |

(56) References Cited

U.S. PATENT DOCUMENTS

| | | |
|---|---|---|
| 2019/0103147 A1 | 4/2019 | Jones et al. |
| 2019/0122723 A1 | 4/2019 | Ito et al. |
| 2019/0129651 A1 | 5/2019 | Wuu et al. |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0348100 A1 | 11/2019 | Smith et al. |
| 2019/0348103 A1 | 11/2019 | Jeong et al. |
| 2019/0362774 A1* | 11/2019 | Kuramori ........... G11C 11/4087 |
| 2019/0385661 A1 | 12/2019 | Koo et al. |
| 2019/0385667 A1* | 12/2019 | Morohashi ........ G11C 11/40611 |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |

FOREIGN PATENT DOCUMENTS

| | | |
|---|---|---|
| CN | 104350546 A | 2/2015 |
| CN | 106710621 A | 5/2017 |
| CN | 107871516 A | 4/2018 |
| JP | 2005-216429 A | 8/2005 |
| JP | 2011-258259 | 12/2011 |
| JP | 2011-258259 A | 12/2011 |
| JP | 4911510 B2 | 1/2012 |
| JP | 2013-004158 A | 1/2013 |
| JP | 6281030 B1 | 1/2018 |
| WO | 2014120477 | 8/2014 |
| WO | 2015030991 A1 | 3/2015 |
| WO | 2017171927 A1 | 10/2017 |
| WO | 2020117686 A1 | 6/2020 |

OTHER PUBLICATIONS

U.S. Appl. No. 15/789,897, entitled "Apparatus and Methods for Refreshing Memory", filed Oct. 20, 2017.

U.S. Appl. No. 15/796,340, entitled: "Apparatus and Methods for Refreshing Memory" filed Oct. 27, 2017.

U.S. Appl. No. 16/012,679, titled "Apparatuses and Methods for Multiple Row Hammer Refresh Address Sequences", filed Jun. 19, 2018.

U.S. Appl. No. 16/020,863, titled "Semiconductor Device", filed Jun. 27, 2018.

U.S. Appl. No. 16/025,844, titled "Apparatus and Methods for Triggering Row Hammer Address Sampling", filed Jul. 2, 2018.

U.S. Appl. No. 16/084,119, titled "Apparatuses and Methods for Pure-Time, Self Adopt Sampling for Row Hammer Refresh Sampling", filed Sep. 11, 2018.

U.S. Appl. No. 16/176,932, titled "Apparatuses and Methods for Access Based Refresh Timing", filed Oct. 31, 2018.

U.S. Appl. No. 16/230,300, titled "Apparatuses and Methods for Staggered Timing of Targeted Refresh Operations" filed Dec. 21, 2018.

U.S. Appl. No. 16/232,837, titled "Apparatuses and Methods for Distributed Targeted Refresh Operations", filed Dec. 26, 2018.

U.S. Appl. No. No. 16/237,291, titled "Apparatus and Methods for Refreshing Memory", filed Dec. 31, 2018.

U.S. Appl. No. 16/286,187 titled "Apparatuses and Methods for Memory Mat Refresh Sequencing" filed Feb. 26, 2019.

U.S. Appl. No. 16/290,730, titled "Semiconductor Device Performing Row Hammer Refresh Operation", filed Mar. 1, 2019.

U.S. Appl. No. 16/374,623, titled "Semiconductor Device Performing Row Hammer Refresh Operation", filed Apr. 3, 2019.

U.S. Appl. No. 16/375,716 titled "Stagger RHR Pumping Scheme Across Die Banks" filed Apr. 4, 2019.

U.S. Appl. No. 15/876,566 entitled 'Apparatuses and Methods for Calculating Row Hammer Refresh Addresses in a Semiconductor Device' filed Jan. 22, 2018.

PCT Application No. PCT/US18/55821 "Apparatus and Methods for Refreshing Memory" filed Oct. 15, 2018.

U.S. Appl. No. 15/715,846, entitled "Semiconductor Device", filed Sep. 26, 2017.

U.S. Appl. No. 15/281,818, entitled: "Semiconductor Device" filed Sep. 30, 2016.

Kim, et al., "Flipping Bits in Memory Without Accessing Them: An Experimental Study of DRAM Disturbance Errors", IEEE, Jun. 2014, 12 pgs.

U.S. Appl. No. 16/537,981 titled "Apparatuses and Methods for Controlling Targeted Refresh Rates" filed Aug. 12, 2019, pp. all.

U.S. Appl. No. 16/655,110 titled "Apparatuses and Methods for Dynamic Targeted Refresh Steals" filed Oct. 16, 2019, pp. all.

U.S. Appl. No. 16/682,606, titled "Apparatuses and Methods for Distributing Row Hammer Refresh Events Across a Memory Device", filed Nov. 13, 2019, pp. all.

International Application No. PCT/US19/40169 titled "Apparatus and Methods For Triggering Row Hammer Address Sampling" filed Jul. 1, 2019, pp. all.

U.S. Appl. No. 16/549,411 titled "Apparatuses and Methods for Dynamic Refresh Allocation" filed Aug. 23, 2019, pp. all.

U.S. Appl. No. 16/886,284 titled "Apparatuses and Methods for Access Based Refresh Timing" filed May 28, 2020, pp. all.

International Search Report & Written Opinion dated Aug. 28, 2020 for PCT Application No. PCT/US2020/032931, pp. all.

U.S. Appl. No. 17/008,396 titled "Apparatuses and Methods for Staggered Timing of Targeted Refresh Operations" filed Aug. 31, 2020; pp. all.

International Application No. PCT/US19/64028, titled "Semiconductor Device Performing Row Hammer Refresh Operation", dated Dec. 2, 2019, pp. all.

International Application No. PCT/US20/26689, titled "Apparatuses and Methods for Staggered Timing of Targeted Refresh Operations", dated Apr. 3, 2020, pp. all.

International Application No. PCT/US20/32931, titled "Apparatuses and Methods for Controlling Steal Rates", dated May 14, 2020, pp. all.

U.S. Appl. No. 16/788,657, titled "Semiconductor Device Performing Row Hammer Refresh Operation", filed Feb. 12, 2020, pp. all.

U.S. Appl. No. 16/818,989, titled "Semiconductor Device Performing Row Hammer Refresh Operation", filed Mar. 13, 2020, pp. all.

(56) References Cited

OTHER PUBLICATIONS

U.S. Appl. No. 16/818,981 titled "Apparatuses and Methods for Staggered Timing of Targeted Refresh Operations" filed Mar. 13, 2020, pp. all.
U.S. Appl. No. 16/208,217, titled "Semiconductor Device Performing Row Hammer Refresh Operation", filed Dec. 3, 2018, pp. all.
U.S. Appl. No. 16/824,460, titled "Semiconductor Device Performing Row Hammer Refresh Operation", filed Mar. 19, 2020, pp. all.
International Search Report & Written Opinion dated Aug. 28, 2020 for PCT Application No. PCT/US2020/032931.
U.S. Appl. No. 17/008,396 titled "Apparatuses and Methods for Staggered Timing of Targeted Refresh Operations" filed Aug. 31, 2020.
U.S. Appl. No. 16/797,658, titles "Apparatuses and Methods for Controlling Refresh Operations", filed Feb. 21, 2020, pp. all.
U.S. Appl. No. 16/805,197, titled "Apparatuses and Methods for Calculating Row Hammer Refresh Addresses in a Semiconductor Device", filed Feb. 28, 2020, pp. all.
U.S. Appl. No. 16/268,818, titled "Apparatuses and Methods for Managing Row Access Counts", filed Feb. 6, 2019, pp. all.
U.S. Appl. No. 16/358,587, titled "Semiconductor Device Having Cam That Stores Address Signals", filed Mar. 19, 2019, pp. all.
U.S. Appl. No. 16/546,152 titled "Apparatuses and Methods for Analog Row Access Tracking" filed Aug. 20, 2019, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 16/425,525 titled "Apparatuses and Methods for Tracking All Row Accesses" filed May 29, 2019, pp. all.
U.S. Appl. No. 16/427,105 titled "Apparatuses and Methods for Priority Targeted Refresh Operations" filed May 30, 2019, pp. all.
U.S. Appl. No. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 16/513,400 titled "Apparatuses and Methods for Tracking Row Accesses" filed Jul. 16, 2019, pp. all.
U.S. Appl. No. 16/997,766 titled "Refresh Logic Circuit Layouts Thereof" filed Aug. 19, 2020, pp. all.
U.S. Appl. No. 17/095,978 titled "Apparatuses and Methods for Controlling Refresh Timing" filed Nov. 12, 2020, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp. all.
U.S. Appl. No. 16/231,327 titled "Apparatuses and Methods for Selective Row Refreshes", filed Dec. 21, 2018, pp. all.
U.S. Appl. No. 16/411,573 titled "Apparatuses, Systems, and Methods for a Content Addressable Memory Cell" filed May 14, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/428,625 titled "Apparatuses and Methods for Tracking Victim Rows" filed May 31, 2019, pp. all.
U.S. Appl. No. 15/656,084, titled: Apparatuses and Methods for Targeted Refreshing of Memory, filed Jul. 21, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 11, 2018, pp. all.
U.S. Appl. No. 16/459,520 titled "Apparatuses and Methods for Monitoring Word Line Accesses", filed Jul. 1, 2019, pp. all.
U.S. Appl. No. 17/030,018, titled "Apparatuses and Methods for Controlling Refresh Operations", filed Sep. 23, 2020, pp. all.
U.S. Appl. No. 16/994,338 titled "Apparatuses, Systems, and Methods for Memory Directed Access Pause" filed Aug. 14, 2020, pp. all.
U.S. Appl. No. 16/997,659 titled "Apparatuses, Systems, and Methods for Refresh Modes" filed Aug. 19, 2020; pp. all.
U.S. Appl. No. 17/127,654 titled "Apparatuses and Methods for Row Hammer Based Cache Lockdown" filed Dec. 18, 2020, pp. all.
U.S. Appl. No. 17/324,621 titled "Apparatuses and Methods for Pure-Time, Self-Adopt Sampling for Row Hammer Refresh Sampling" filed May 19, 2021, pp. all.

\* cited by examiner ents in which the described systems and methods may be practiced. These embodiments are described in sufficient detail to enable those skilled in the art to practice presently disclosed systems and methods, and it is to be understood that other embodiments may be utilized and that structural

APPARATUSES AND METHODS FOR CONTROLLING STEAL RATES

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Typically, memory cells are arranged in an array that includes a series of rows referred to as word lines and columns referred to as bit lines. An auto-refresh operation may be carried out where the memory cells of one or more word lines are periodically refreshed to preserve data stored in the memory cells. Repeated access to a particular memory cell or group of memory cells, such as a word line, may cause an increased rate of data degradation in nearby memory cells (e.g., adjacent word lines). This repeated access is often referred to as a 'row hammer.' To preserve the data in nearby memory cells, the word lines of the nearby memory cells may need to be refreshed at a rate higher than a rate of the auto-refresh operations. However, extra refresh operations increase power consumption and may interfere with other memory operations. Accordingly, reducing extra refresh operations is desired.

DETAILED DESCRIPTION

Figure 1:
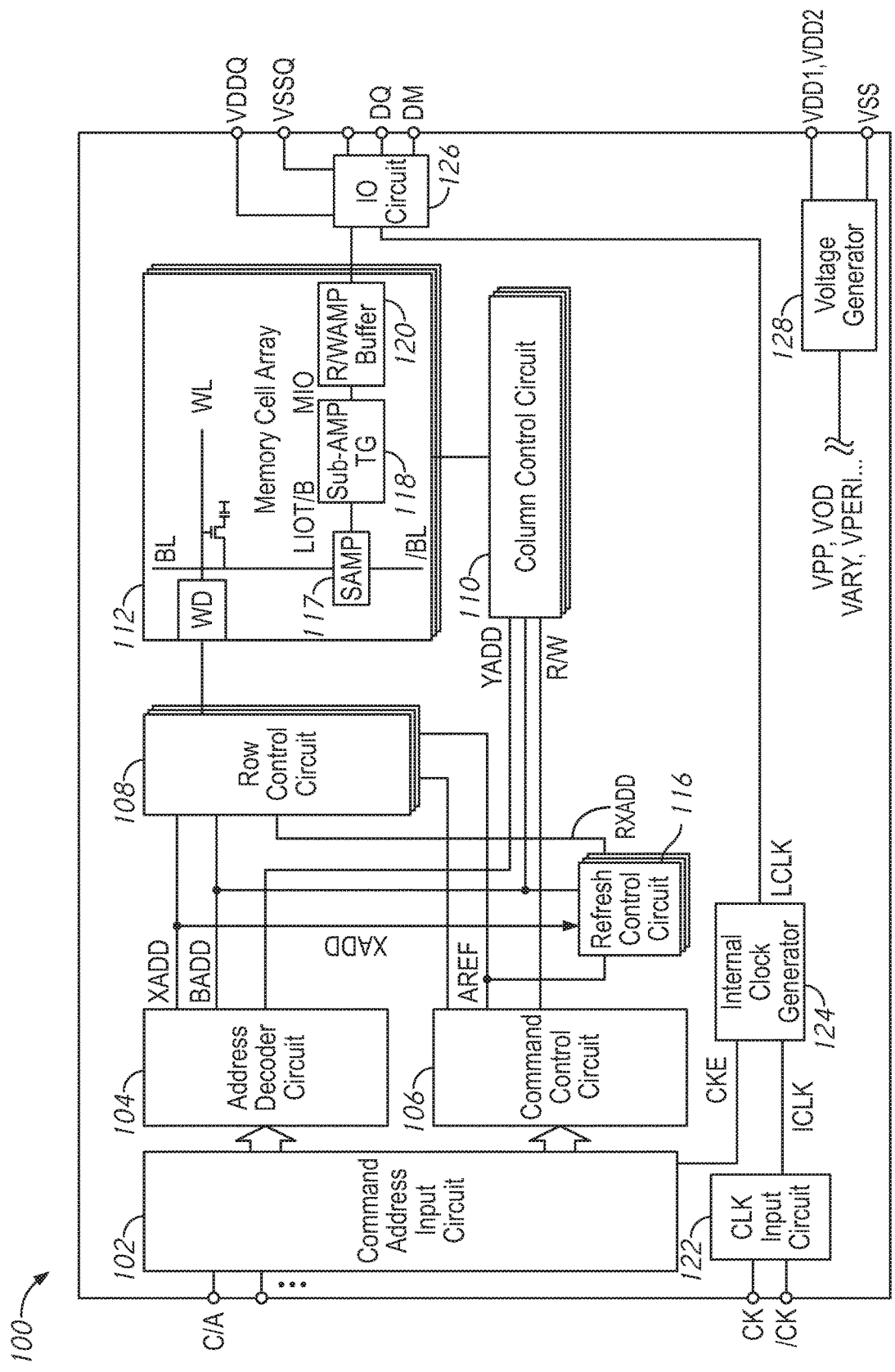
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of word lines (rows) and bit lines (columns). A number of word lines and bit lines may be organized into a memory bank. The memory device may include a number of different memory banks. The memory device may receive one or more command signals which may indicate operations in one or more of the banks of one or more memory packages. For example, the memory device may enter a refresh mode, in which word lines in one or more of the memory banks are refreshed.

Information in the memory cells may decay over time. The memory cells may be refreshed on a row-by-row (e.g., word line-by-word line) basis to preserve information in the memory cells. During a refresh operation, the information in one or more rows may be rewritten back to the respective word line to restore an initial value of the information. Repeated access to a given word line (e.g., an aggressor word line) may cause an increased rate of information decay in one or more neighboring word lines (e.g., victim word lines). In some applications, victim word lines may be considered to be the word lines which are physically adjacent to the aggressor word line. For example, victim word lines may be physically adjacent to the aggressor word line, that is, the victim word lines may be physically on either side of the aggressor word line (e.g., R+1 and R−1). In some embodiments, the word lines which are physically adjacent to the adjacent word lines (e.g., R+2 and R−2) may also be treated as victim word lines. In some applications, such as memories where word lines are densely spaced, more distant word lines may also be considered as victim word lines (e.g., R+3, R−3, R+4, R−4, etc.). Other relationships between victim and aggressor word lines may be used in other example embodiments.

Accesses to different word lines of the memory may be tracked in order to determine if a word line is an aggressor word line. For example, the row address of the accessed word lines and/or aggressor word lines may be stored in a register (e.g., file) or other storage device in the memory. If a word line is determined to be an aggressor word line, victim addresses associated with the victim word lines may be determined based, at least in part, on a row address of the aggressor word line. In some embodiments, the victim word lines (e.g., R+1, R−1, R+2, and R−2) may be refreshed as part of a targeted (or 'row hammer') refresh operation and thus there may be, for example, four victim addresses refreshed for each determined aggressor row address. A row address for a victim word line refreshed during a targeted refresh operation may be referred to as a targeted refresh address.

In some embodiments, some time slots for refresh operations may be reserved for auto-refresh operations and some time slots may be reserved for targeted refresh operations. In some embodiments, a targeted refresh address may be issued in a time slot which would otherwise have been assigned to an auto-refresh address (e.g., "steal") if no row hammer management was needed. In some embodiments, certain refresh time slots may be reserved for targeted refresh addresses. These time slots may be referred to as targeted refresh time slots. The time period between time slots reserved for targeted refresh addresses may be referred to as the targeted refresh rate or steal rate.

Different victim word lines of an aggressor word line may not be affected in the same manner by a row hammer. For example, victim word lines closer to the aggressor word line (e.g., adjacent victim word lines, R+/−1) may suffer a higher rate of data degradation than more distant victim word lines (e.g., R+/−2). Accordingly, it may be desirable to perform targeted refresh operations on different victim word lines at different rates. For example, the R+/−1 victim word lines may be refreshed at four times the rate of the refreshing of R+/−2 victim word lines. In another example, the R+/−1 victim word lines may be refreshed at eight times the rate of the refreshing of R+/−2 victim word lines. In some applications, it may be desirable to be able to adjust the targeted refresh rate of the different victim word lines independently from one another. That is, the targeted refresh rate of R+/−2 may not depend on the targeted refresh rate of R+/−1. This may allow the targeted refresh rates for each type of victim word line to be optimized, which may reduce over-refreshing of the word lines.

The present disclosure is drawn to apparatuses and methods for controlling targeted refresh rates (e.g., steal rates). More specifically, the present disclosure is drawn to apparatuses and methods for independently controlling the steal rates for different victim word lines, such as victim word lines that have different physical distances from an aggressor word line. In some embodiments, a refresh control circuit may include two or more timing circuits to allow independent control of the steal rates for different victim word lines.

FIG. 1 is a block diagram showing an overall configuration of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control circuit 108 and the selection of the bit lines BL and /BL is performed by a column control circuit 110. In some embodiments, there may be a row control circuit 108 and column control circuit 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control circuit 106 and to an internal clock generator circuit 124. The internal clock generator circuit 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder circuit 104. The address decoder circuit 104 receives the address and supplies a decoded row address XADD to the row control circuit 108 and supplies a decoded column address YADD to the column control circuit 110. The row address XADD may be used to specify one or more word lines WL of the memory array 112 and the column address YADD may specify one or more bit lines BL of the memory array 112. The address decoder circuit 104 may also provide a bank address BADD, which specifies a particular bank of the memory. The bank address BADD may be provided to the row control circuit 108 and/or column control circuit 110 to direct access operations to one or more of the banks. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and/or bank address BADD to indicate the memory cell(s) to be accessed.

The commands may be provided as internal command signals to a command control circuit 106 via the command/address input circuit 102. The command control circuit 106 includes circuits to decode the internal command signals to generate various internal signals and commands for performing operations. For example, the command control circuit 106 may provide a row command signal to select a word line and a column command signal to select a bit line.

The device 100 may receive an access command which is a row activation command ACT. When the row activation command ACT is received, a row address XADD is timely supplied with the row activation command ACT.

The device 100 may receive an access command which is a read command. When a read command is received, a bank address BADD and a column YADD address are timely supplied with the read command, read data is read from memory cells in the memory array 112 corresponding to the row address XADD and column address YADD. The read command is received by the command control circuit 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control circuit 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control circuit 106 receives a signal which indicates a refresh command. In some embodiments, the refresh command may be externally issued to the memory device 100. In some embodiments, the refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at a desired internal timing. Thus, refresh operations may continue automatically. A self-refresh exit command may cause the automatic activation of the refresh signal AREF to stop and return to an IDLE state.

The refresh control circuit 116 supplies a refresh row address RXADD to the row control circuit 108, which may refresh one or more word lines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

One type of refresh operation may be an auto-refresh operation. Responsive to an auto-refresh operation the memory bank may refresh a word line or a group of word lines of the memory, and then may refresh a next word line or group of word lines of the memory bank responsive to a next auto-refresh operation. The refresh control circuit 116 may provide an auto-refresh address as the refresh address RXADD which indicates a word line or a group of word lines in the memory bank. The refresh control circuit 116 may generate a sequence of refresh addresses RXADD such that over time the auto-refresh operation may cycle through all the word lines WL of the memory bank. The timing of refresh operations may be such that each word line is refreshed with a frequency based, at least in part, on a normal rate of data degradation in the memory cells (e.g., auto-refresh rate).

Another type of refresh operation may be a targeted refresh operation. As mentioned previously, repeated access to a particular word line of memory (e.g., an aggressor word line) may cause an increased rate of decay in neighboring word lines (e.g., victim word lines) due, for example, to electromagnetic coupling between the word lines. In some embodiments, the victim word lines may include word lines which are physically adjacent to the aggressor word line. In some embodiments, the victim word lines may include word lines further away from the aggressor word line. Information in the victim word line may decay at a rate such that data may be lost if they are not refreshed before the next auto-refresh operation of that word line. In order to prevent information from being lost, it may be necessary to identify aggressor word lines and then carry out a targeted refresh operation where a refresh address RXADD associated with one or more associated victim word lines is refreshed.

The refresh control circuit 116 may selectively output a targeted refresh address (e.g., a victim row address) or an automatic refresh address (e.g., auto-refresh address) as the refresh address RXADD. The auto-refresh addresses may be from a sequence of addresses which are provided based on activations of the auto-refresh signal AREF. The refresh control circuit 116 may cycle through the sequence of auto-refresh addresses at a rate determined by AREF. In some embodiments, the sequence of auto-refresh addresses may be generated by updating (e.g., incrementing) one or more portions of the previous auto-refresh address.

The refresh control circuit 116 may also determine targeted refresh addresses which are addresses that require refreshing (e.g., victim row addresses corresponding to victim word lines) based on the access pattern of nearby addresses (e.g., aggressor row addresses corresponding to aggressor word lines) in the memory array 112. The refresh control circuit 116 may selectively use one or more signals of the device 100 to calculate the refresh address RXADD. For example, the refresh address RXADD may be calculated based on the row addresses XADD provided by the address decoder circuit 104. The refresh control circuit 116 may receive the current value of the row address XADD provided by the address decoder circuit 104 and determine a targeted refresh address based on one or more of the received addresses XADD.

The refresh address RXADD may be provided with a timing based on a timing of the refresh signal AREF. The refresh control circuit 116 may have time slots corresponding to the timing of AREF, and may provide one or more refresh addresses RXADD during each time slot. A targeted refresh address may be issued in a time slot which would otherwise have been assigned to an auto-refresh address (e.g., "steal"). In some embodiments, certain time slots may be reserved for targeted refresh addresses. These time slots may be referred to as a targeted refresh intervals or targeted refresh time slots. The time period between time slots reserved for targeted refresh addresses may be referred to as the targeted refresh rate or steal rate.

In some embodiments, certain targeted refresh time slots may be reserved for refreshing a type of victim word line while other targeted refresh time slots may be reserved for refreshing another type of victim word lines. For example, certain targeted refresh time slots may be reserved for refreshing R+/−1 victim word lines and other targeted refresh time slots may be reserved for refreshing R+/−2 victim word lines. In some embodiments, the steal rates for the targeted refresh time slots for the different types of victim word lines may be different. In some embodiments, the steal rates for the targeted refresh time slots for the different types of victim word lines may be independent of one another.

The refresh control circuit 116 may receive the row addresses XADD provided by the address decoder circuit 104 and may determine which word lines are being hammered based on the row addresses XADD. For example, the refresh control circuit 116 may count accesses to the word lines and may determine which word lines are aggressors based on the count of the accesses (e.g., reach a threshold value). The row addresses XADD and access count values may be stored by the refresh control circuit 116. When an aggressor word line is determined, the refresh control circuit 116 may calculate victim word lines associated with the aggressor word line and perform targeted refresh operations as previously described.

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 126 does not propagate to the other circuit blocks.

Figure 2:
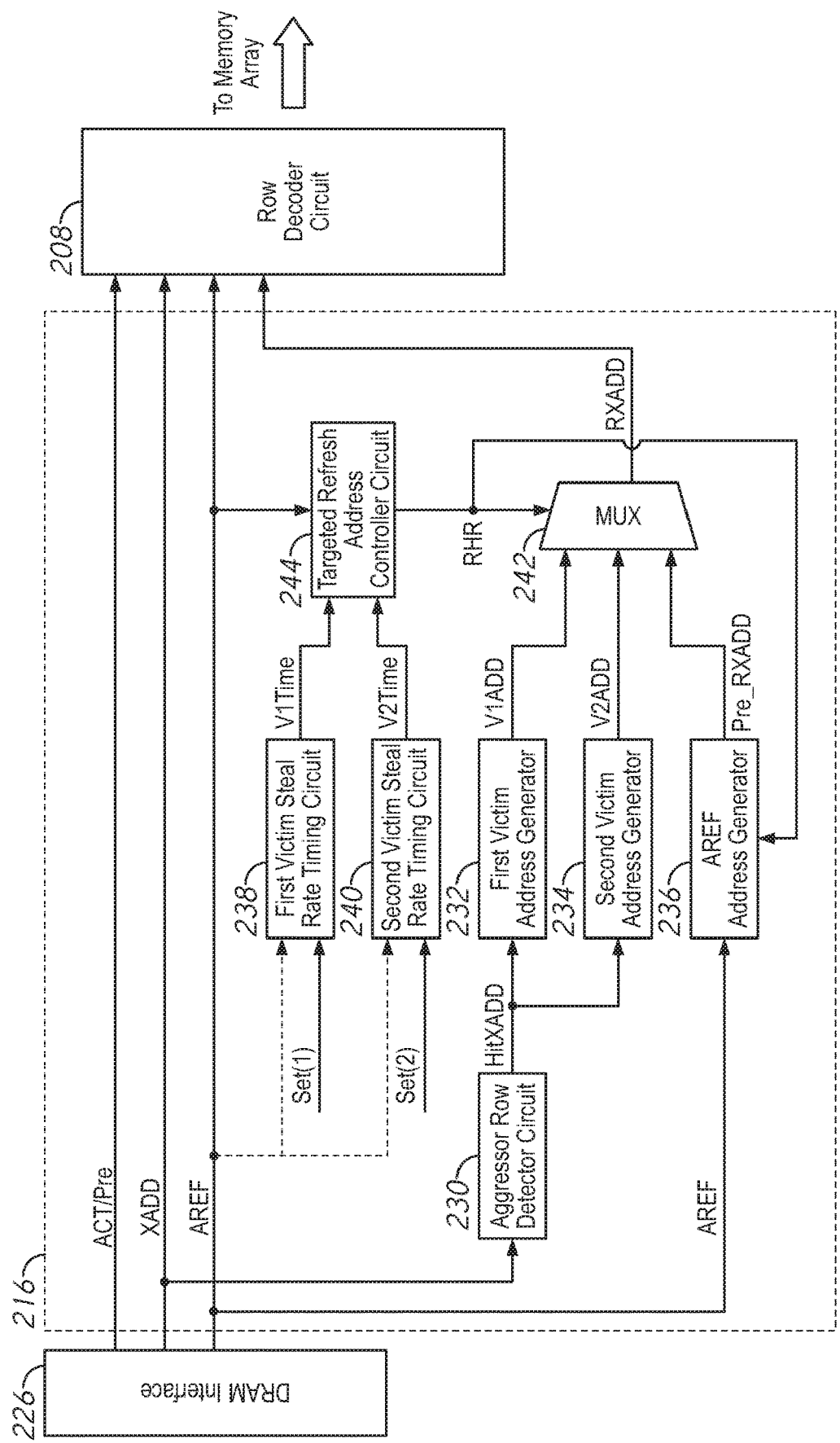
FIG. 2 is a block diagram of a refresh control circuit according to an embodiment of the present disclosure.

FIG. 2 is a block diagram of a refresh control circuit 216 according to an embodiment of the present disclosure. In some embodiments, the refresh control circuit 216 may be included in a memory device, such as memory device 100 shown in FIG. 1. For context, a DRAM interface 226 and a row decoder circuit 208 are also shown in FIG. 2. In some embodiments, refresh control circuit 216 may be included in refresh control circuit 116 shown in FIG. 1. In some embodiments, row decoder circuit 208 may be included in row control circuit 108. In some embodiments, some of the components (e.g., the refresh control circuit 216 and row decoder circuit 208) may be provided for a particular bank of memory and these components may be repeated for each of the banks of memory. Thus, there may be multiple refresh control circuits 216 and row decoder circuits 208 in a memory device. For the sake of brevity, only components for a single bank will be described.

A DRAM interface 226 may provide one or more signals to an address refresh control circuit 216 and row decoder circuit 208. The refresh control circuit 216 may include an aggressor row detector circuit 230, a first victim address generator 232, a second victim address generator 234, an auto-refresh (AREF) address generator 236, a first victim steal rate timing circuit 238, a second victim steal rate timing circuit 240, a multiplexer 242, and a targeted refresh address controller circuit 244. The DRAM interface 226 may provide one or more control signals, such as an auto-refresh signal AREF, an activation/precharge signal ACT/Pre, and a row address XADD.

The DRAM interface 226 may represent one or more components which provides signals to components of a memory bank, such as refresh control circuit 216 and row decoder circuit 208. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder circuit 104, and/or the command control circuit 106 of FIG. 1. The DRAM interface 226 may provide a row address XADD, the auto-refresh signal AREF, an activation signal ACT, and/or a precharge signal Pre. The auto-refresh signal AREF may be a periodic signal which may indicate when an auto-refresh operation is to occur. The activation signal ACT may be provided to activate a given bank of the memory. The row address XADD may be a signal including multiple bits (which may be transmitted in series or in parallel) and may correspond to a specific row of a memory bank (e.g., the memory bank activated by ACT/Pre).

During a memory operation, the aggressor row detector circuit 230 may receive the current row address XADD. In some embodiments, the aggressor row detector circuit 230 may store the current value of the row address XADD. The aggressor row detector circuit 230 may further store a count value associated with each stored row address. The count value for a row address may be adjusted (e.g., incremented) each time the row address stored in the aggressor row detector circuit 230 is received as XADD.

For each row address XADD stored in the aggressor row detector circuit 230, the aggressor row detector circuit 230 may determine if the current row address XADD is an aggressor row address based on one or more previously stored row addresses. For example, in some embodiments, the aggressor row detector circuit 230 may determine a row address is an aggressor row address based on a number of times the row address XADD is received (e.g., the count value of the stored row address exceeds a threshold value). The aggressor row detector circuit 230 may then reset the count value associated with the aggressor row address. Other aggressor row detection methods may be used in other embodiments. When an aggressor row address is identified, the aggressor row detector circuit 230 may provide the matched address HitXADD to the first victim address generator 232 and the second victim address generator 234 in some embodiments.

The row address XADD may change as the DRAM interface 226 directs access operations (e.g., read and write operations) to different rows of the memory cell array (e.g., memory cell array 118 of FIG. 1). In some embodiments, the aggressor row detector circuit 230 may store every received row address XADD. In other embodiments, the aggressor row detector circuit 230 may store received row addresses responsive to an active sample signal provided by a sample timing generator (not shown). In some embodiments, the sample signal may be a pulse signal. That is, it may transition to an active state and return to an inactive state after a time period (e.g., half a clock cycle, one clock cycle). The sample generator may regularly, randomly, or pseudo-randomly vary a time interval between pulses of the sample signal.

The first victim address generator 232 and the second victim address generator 234 calculate one or more row addresses to be refreshed based on aggressor row addresses identified by the aggressor row detector circuit 230 (e.g. row addresses XADD associated with count values above a threshold value). The row addresses calculated by the first victim address generator 232 and the second victim address generator 234 may be victim row addresses corresponding to victim word lines of an aggressor word line associated with HitXADD. The first victim address generator 232 and the second victim address generator 234 may be provided the match address HitXADD as input. The first victim address generator 232 may provide a targeted refresh address V1ADD and the second victim address generator 234 may provide targeted refresh address V2ADD in response to these inputs. The targeted refresh addresses may be an addresses for a memory location (e.g., a word line) that may be affected by repeated activation of the memory location corresponding to the match address HitXADD. In other words, the match address HitXADD may be an 'aggressor' row address, and the targeted refresh address V1ADD and V2ADD may be a 'victim' addresses. Different calculations may be used for generating different victim addresses as the targeted refresh addresses V1ADD and V2ADD.

The first victim address generator 232 and the second victim address generator 234 may employ different calculations for generating victim row addresses. In one example, a first calculation may be used by the first victim address generator 232, and a second calculation may be used by the second victim address generator 234. The calculations may provide targeted refresh addresses V1ADD or V2ADD corresponding to word lines which have a known physical relationship (e.g., a spatial relationship) with a word line corresponding to the match address HitXADD. In some embodiments, the different calculations may be based on different physical relationships between the victim word line and the aggressor word line. The calculations may result in a single targeted refresh address for V1ADD and/or V2ADD in some embodiments of the disclosure. The calculations may result in a sequence of targeted refresh addresses for V1ADD and/or V2ADD in other embodiments of the disclosure.

In one embodiment, the first calculation may cause the first victim address generator 232 to output a pair of addresses which correspond to word lines that are adjacent to the word line corresponding to the match address HitXADD (e.g., V1ADD=HitXADD+/−1). The second calculation may cause the second victim address generator 234 to output a pair of addresses which correspond to word lines that are adjacent to word lines corresponding to the addresses HitXADD+/−1 (e.g., V2ADD=HitXADD+/−2). In other words, the second calculation may output a pair of addresses that correspond to victim word lines adjacent to the victim word lines corresponding to the addresses VADD. Other calculations are possible in other example embodiments. For example, the first calculation may be based on a physical relationship with the match address HitXADD, while the second calculation may be based on a physical relationship with the address(es) provided by the first calculation. The targeted addresses V1ADD and V2ADD calculated by the first victim address generator 232 and the second victim address generator 234 may be provided to a multiplexer 242 in some embodiments. In some embodiments, the first victim address generator 232 and the second victim address generator 234 may include buffers (not shown) for storing victim row addresses to be provided to the multiplexer 242 during subsequent targeted refresh operations.

The AREF address generator 236 generates an auto-refresh address Pre_RXADD in response to the refresh signal AREF. The auto-refresh address Pre_RXADD may be part of a sequence of addresses to be refreshed as part of an auto-refresh operation. The AREF address generator 236 may update the current auto-refresh address Pre_RXADD to a next address in the sequence in response to an active refresh signal AREF. The AREF address generator 236 is also provided the command signal RHR from targeted refresh address controller circuit 244. In some embodiments, when the command signal RHR is active, the AREF address generator 236 may be controlled to stop updating the automatic refresh address Pre_RXADD even if the automatic refresh signal AREF is active. As described herein, since the active command signal RHR indicates that a targeted refresh operation is to be conducted instead of an automatic refresh operation, this allows the automatic refresh operation to be suspended while the targeted refresh is carried out, and resumed when the command signal RHR is not active.

The multiplexer 242 accepts the automatic refresh address Pre_RXADD provided by the AREF address generator 236, V1ADD provided by first victim address generator 232, V2ADD provided by second victim address generator 234, and outputs one of them as the refresh address RXADD. The multiplexer 242 may select between the refresh addresses based on the command signal RHR. Targeted refresh address controller circuit 244 provides an output RHR to the multiplexer 242 to control selection of providing the Pre_RXADD, V1ADD, or V2ADD addresses as the refresh address RXADD.

First victim steal rate timing circuit 238 may provide a timing signal V1Time that may determine a rate at which victim row address V1ADD is provided as RXADD. Second victim steal rate timing circuit 240 may provide a timing signal V2Time that may determine a rate at which victim row address V2ADD is provided as RXADD. Timing signals V1Time and V2Time may be periodic signals that alternate between active and inactive states (e.g., between high and low logic levels). The timing signals V1Time and V2Time may operate at different frequencies in some embodiments. For example, in some embodiments, V1Time may have a higher frequency than V2Time. In these embodiments, this may cause victim row address V1ADD to be provided as RXADD at a higher frequency than V2ADD. The first victim steal rate timing circuit 238 and the second victim steal rate timing circuit 240 may be independent. That is, neither timing circuit requires an input from the other timing circuit to generate its output. In some embodiments, the timing circuits may each receive at least one input unique to the timing circuit such that the timing circuits do not receive completely identical inputs.

The first victim steal rate timing circuit 238 and/or the second victim steal rate timing circuit 240 may include a square wave generating circuit for generating the outputs V1Time and V2Time, respectively. For example, a Schmitt waveform generator, a 555 timer (not shown), and/or a ring-type waveform generator may be included in the first victim steal rate timing circuit 238 and/or the second victim steal rate timing circuit 240. As indicted by Set(1) and Set(2) in FIG. 2, the frequencies of V1Time and/or V2Time may be set by fuses, antifuses, programming one or more mode registers, and/or other frequency setting method. For example, the frequencies may be set by providing a timing control voltage via/responsive to a command signal from the DRAM interface 226 in some embodiments.

Optionally, in some embodiments, the first victim steal rate timing circuit 238 and/or the second victim steal rate timing circuit 240 may receive the AREF signal to synchronize the activation of the V1Time and/or V2Time with the AREF signal. This may help ensure that the V1Time and/or V2Time signals are activated during refresh operations rather than between refresh operations when the timing signals may be ignored.

The targeted refresh address controller circuit 244 may receive V1Time, V2Time, and AREF as inputs and provide control signal RHR based on these inputs. Targeted refresh address controller circuit 244 may include logic gates and/or other circuitry to generate control signal RHR. Control signal RHR may have multiple states in some embodiments.

In some embodiments, control signal RHR may be a multi-bit signal with multiple states (e.g., '00', '01,' '10,' '11'). For example, RHR may have a first state when AREF is inactive, regardless of the states of V1Time and V2Time, a second state when AREF is active and V1Time is active, a third state when AREF is active and V2Time is active, and a fourth state when AREF is active and neither V1Time nor V2Time are inactive. In some embodiments, V1Time and V2Time may be prohibited from being active at the same time. In some embodiments, the targeted refresh address controller circuit 244 may favor one timing signal over another. For example, if both V1Time and V2Time are active, targeted refresh address control circuit 244 may favor V1Time and provide RHR in the second state.

In some embodiments, the multiplexer 242 may provide V1ADD as RXADD when RHR is in a state indicating AREF and V1Time are active, provide V2ADD as RXADD when RHR is in a state indicating AREF and V2Time are active, and provide Pre_RXADD when RHR is in a state indicating only AREF is active. When AREF is inactive, no address may be provided as RXADD and/or the row decoder circuit 208 may ignore RXADD when AREF is inactive.

The row decoder circuit 208 may perform one or more operations on the memory array (not shown) based on the received signals and addresses. For example, responsive to the activation signal ACT and the row address XADD (and AREF being at a low logic level), the row decoder circuit 208 may direct one or more access operations (for example, a read operation) on the specified row address XADD. Responsive to the AREF signal being active, the row decoder circuit 208 may refresh the refresh address RXADD.

Although the example illustrated in FIG. 2 shows two victim steal rate timing circuits and two victim address generators, it is understood that additional victim steal rate timing circuits and victim address generators may be included in other embodiments. For example, it may be desirable to have separate steal rate timing for additional victim word line types (e.g., R+/–3, R+/–4) and perform targeted refresh operations on these additional victim word lines.

Figure 3:
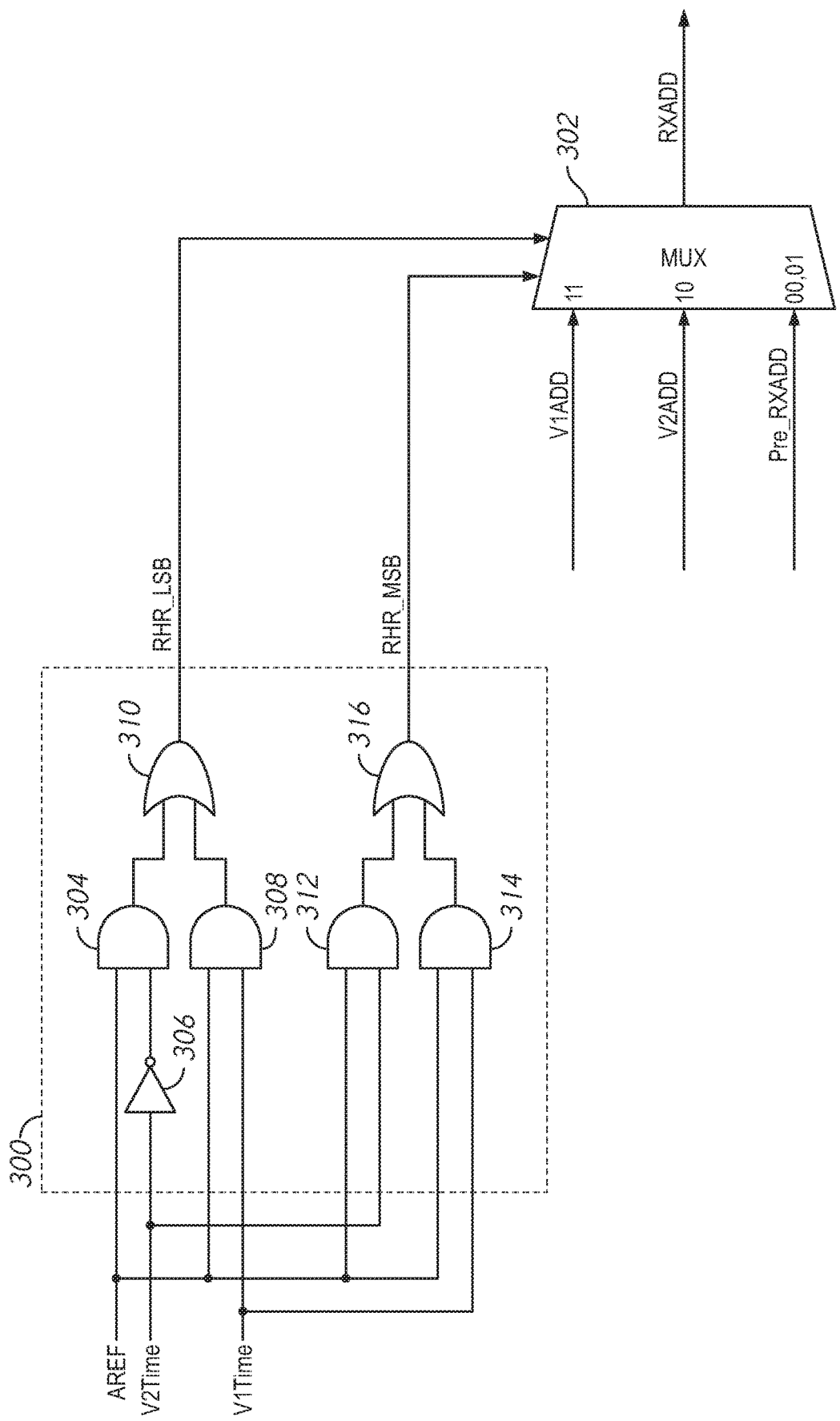
FIG. 3 is a circuit diagram of an example targeted refresh address controller circuit according to an embodiment of the present disclosure.

FIG. 3 is a circuit diagram of an example targeted refresh address controller circuit 300 according to an embodiment of the present disclosure. In some embodiments, the targeted refresh address controller circuit 300 may be included in targeted refresh address controller circuit 244 shown in FIG. 2. For context, a multiplexer 302 is also shown in FIG. 3. Multiplexer 302 may be included in multiplexer 242 shown in FIG. 2 in some embodiments.

The targeted refresh address controller circuit 300 may receive refresh signal AREF, a first timing signal V1Time, and a second timing signal V2Time. In some embodiments, the refresh signal AREF may be provided by a command control circuit such as command control circuit 106 shown in FIG. 1. In some embodiments, the refresh signal AREF may be provided via a DRAM interface such as DRAM interface 226 shown in FIG. 2. In some embodiments, the first timing signal V1Time and/or the second timing signal V2Time may be provided by victim steal rate timing circuits, such as first victim steal rate timing circuit 238 and second victim steal rate timing circuit 240 shown in FIG. 2. Based on the refresh signal AREF and timing signals V1Time and V2Time, the targeted refresh address controller circuit 300 may provide control signal RHR to the multiplexer 302. The state of the control signal RHR may determine what row address is provided as the refresh address RXADD. In the example shown in FIG. 3, the control signal RHR is a two-bit signal including a least significant bit RHR_LSB and a most significant bit RHR_MSB.

The multiplexer 302 may provide a first victim row address V1ADD, a second victim row address V2ADD, or an auto-refresh address Pre-RXADD as RXADD depending on the state of the RHR signal. In some embodiments, the first victim row address V1ADD and/or second victim row address V2ADD may be provided by victim row address generators, such as first victim row address generator 232 and second victim row address generator 234 shown in FIG. 2. In some embodiments, the auto-refresh address Pre_RXADD may be provided by an auto-refresh address generator, such as AREF address generator 236 shown in FIG. 2. In some embodiments, the first victim row address V1ADD may include one or more victim row addresses that correspond to one or more victim word lines having a first physical relationship to an aggressor word line. In some embodiments, the second victim row address V2ADD may include one or more victim row addresses that correspond to one or more victim word lines having a second physical relationship to the aggressor word line. For example, the first victim row address V1ADD may correspond to victim word lines physically adjacent to the aggressor word line and the second victim row address V2ADD may correspond to victim word lines physically adjacent to the victim word lines corresponding to V1ADD.

In some embodiments, the targeted refresh address controller circuit 300 may include a first AND gate 304 that receives the AREF signal at a first input and an inverted V2Time signal at a second input. The V2Time signal may be inverted by inverter 306. A second AND gate 308 may receive the AREF signal and the V1Time signal at its inputs. The outputs of the first AND gate 304 and the second AND gate 308 may be provided to a first OR gate 310. Based on the inputs, the first OR gate 310 may output RHR_LSB. The targeted refresh address controller circuit 300 may include a third AND gate 312 that receives AREF and V2Time signals as inputs. A fourth AND gate 314 may receive the AREF and V1Time signals as inputs. The outputs of the third AND gate 312 and the fourth AND gate 314 may be provided to a second OR gate 316. The OR gate 316 may provide RHR_MSB as an output.

In the example shown in FIG. 3, the multiplexer 302 is configured to provide Pre_RXADD when RHR is in state '00' or '01,' provide V2ADD when RHR is in state '10,' and provide V1ADD when RHR is in state '11.' In operation, the targeted refresh address controller circuit 300 provides RHR in state '00' when AREF is inactive (e.g., logic low) regardless of the states of V1Time and V2Time. Although the multiplexer 302 may provide Pre_RXADD as RXADD in this state, as mentioned previously, it may be ignored by a row decoder circuit since a refresh operation is not occurring. When AREF is active (e.g., logic high) and V1Time and V2Time are inactive, RHR is in state '01.' In response, the multiplexer 302 may provide Pre_RXADD as RXADD, which may be received by a row decoder circuit for use during a refresh operation. When AREF and V1Time are active and V2Time is inactive, RHR is in state '11' and the multiplexer 302 provides victim row address V1ADD as RXADD. When AREF and V2Time are active and V1Time is inactive, RHR is in state '10' and the multiplexer 302 provides victim row address V2ADD as RXADD.

In the example shown in FIG. 3, when AREF, V1Time, and V2Time are all active, RHR is in a state '11' and VADD is provided as RXADD. Thus, in the event of a conflict between V1Time and V2Time, the victim word lines associated with V1ADD are favored for refreshing over word lines associated with V2ADD. This may be desirable if, as in the example described above, the word lines associated with V1ADD are in closer physical proximity to the aggressor word line than word lines associated with V2ADD. However, in other embodiments, alternative logic gates may be provided to favor word lines associated with V2ADD over word lines associated with V1ADD when there is a conflict between V1Time and V2Time. In other embodiments, additional circuitry and/or logic gates may be provided that prevent V1Time and V2Time from being active at the same time.

Although not shown in FIG. 3, in some embodiments, RHR_MSB may be provided to an auto-refresh address generator, such as AREF address generator 236 shown in FIG. 2. The auto-refresh address generator may use the RHR_MSB signal to pause the generation of auto-refresh addresses during targeted refresh address operations as discussed previously with reference to FIG. 2.

Figure 4:
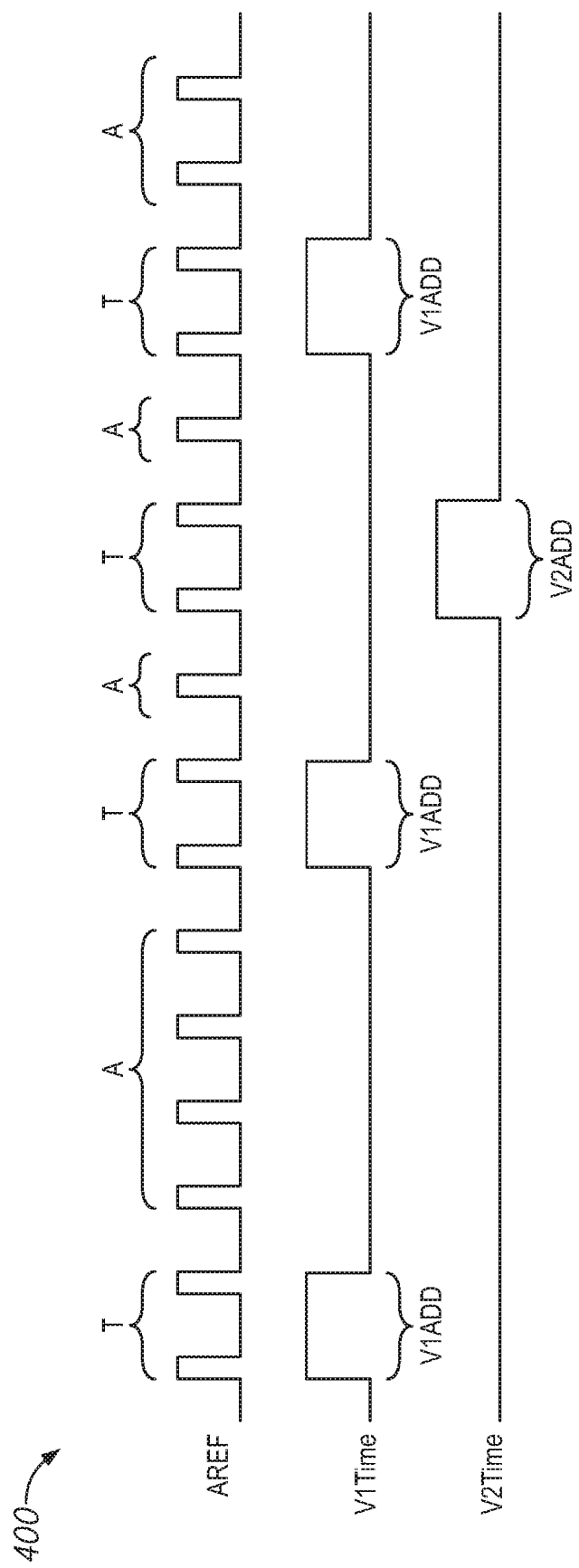
FIG. 4 is an example timing diagram of a refresh signal, a first timing signal, and a second timing signal in accordance with an embodiment of the present disclosure.

FIG. 4 is an example timing diagram of a refresh signal, a first timing signal, and a second timing signal in accordance with an embodiment of the present disclosure. Timing diagram 400 shows refresh signal AREF, first timing signal V1Time, and second timing signal V2Time. In some embodiments, the refresh signal AREF may be provided by a command control circuit such as command control circuit 106 shown in FIG. 1. In some embodiments, the refresh signal AREF may be provided via a DRAM interface such as DRAM interface 226 shown in FIG. 2. In some embodiments, the first timing signal V1Time and/or the second timing signal V2Time may be provided by victim steal rate timing circuits, such as first victim steal rate timing circuit 238 and second victim steal rate timing circuit 240 shown in FIG. 2. AREF, V1Time, and V2Time may be used to control a targeted refresh address controller circuit, such as targeted refresh address controller circuit 244 shown in FIG. 2 or targeted refresh address controller circuit 300 shown in FIG. 3. Other components of a refresh control circuit, such as refresh control circuit 116 shown in FIG. 1 or refresh control circuit 216 shown in FIG. 2, may receive AREF, V1Time, and/or V2Time in some embodiments.

The timing diagram 400 as shown displays the state of the signals for a refresh control circuit which refreshes first victim word lines at a first rate based off of the rate of timing signal V1Time, and second victim word lines refreshed at a second rate based off of the rate of timing signal V2Time. In this example, the first victim word lines are a pair of word lines adjacent to an aggressor word line. The first victim word lines may be associated with a victim row address V1ADD. The second victim word lines are a pair of word lines which are each adjacent to one of the first victim word lines. The second victim word lines may be associated with a victim row address V2ADD. Other circuits may employ other operations wherein, for example, neither set of word lines are adjacent to the aggressor word line.

Figure 6:
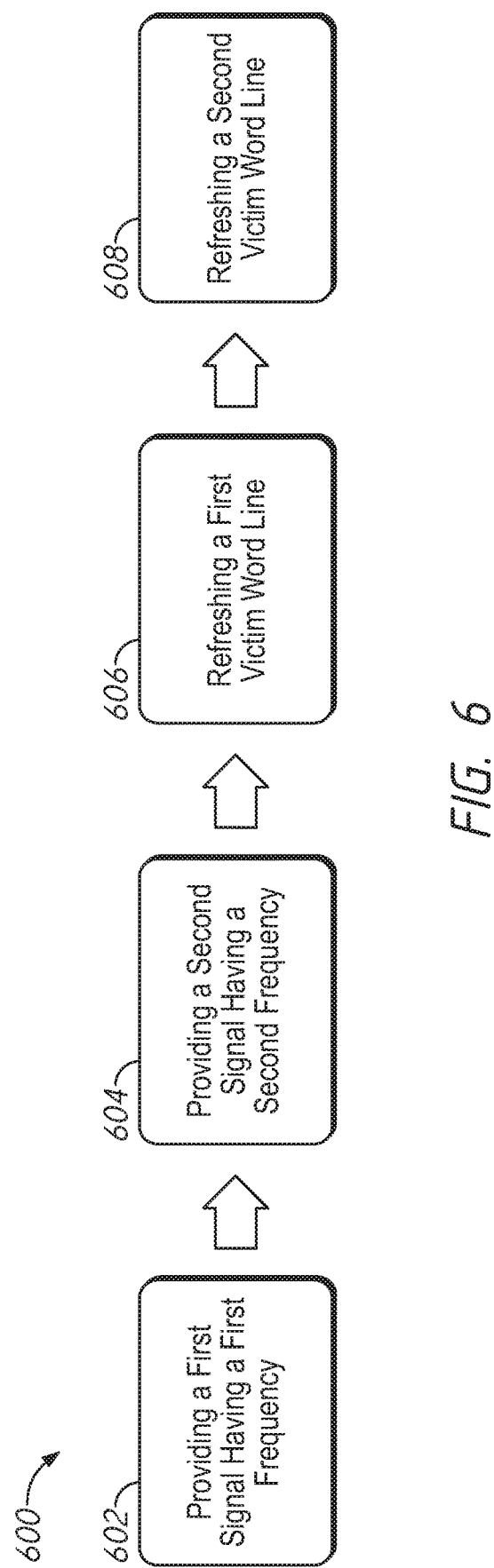
FIG. 6 is a flow chart of a method according to an embodiment of the present disclosure.

The first two line of FIG. 6 shows a portion of the refresh signal AREF. The refresh signal AREF may be a sequence of pulses (e.g., from a low to a high logic level for a set duration). The refresh signal AREF may occur in a set pattern, at regular intervals in time. The refresh signal AREF may control refresh operations, which refreshes one or more word lines of a memory. As discussed herein, the refresh signal AREF may be used to trigger a refresh operation in the memory. As shown, some of the individual pulses have been labeled "T" or "A" to indicate that a targeted refresh operation or an auto-refresh operation is being conducted, respectively, during the period when that particular AREF pulse is active.

The second line of FIG. 4 shows first timing signal V1Time. As shown, the first command signal V1Time is a periodic pulse signal. The first timing signal V1Time may have a duration longer than the duration of each of the pulses of the refresh signal AREF in some embodiments. In this example, the first timing signal V1Time indicates that word lines adjacent to an aggressor word line are to be refreshed (e.g., the refreshed addresses are V1ADD). When the first timing signal V1Time is active, a first activation of refresh signal AREF will instead refresh a first adjacent victim word line (e.g., R+1), and the second activation of refresh signal AREF will refresh a second adjacent victim word line (e.g., R−1).

The third line of FIG. 4 shows second timing signal V2Time. As shown, the second timing signal V2Time may also be a periodic pulse signal. In the example shown in FIG. 4, the frequency of second timing signal V2Time is different than the frequency of first timing signal V1Time. The pulse of the second timing signal V2Time may have a duration equal to a duration of the pulse of the first timing signal V1Time in some embodiments. In this example, the second timing signal V2Time indicates that word lines adjacent to the victim word lines adjacent to the aggressor word line are to be refreshed (e.g., the refreshed addresses are V2ADD). When the second timing signal V2Time is active, a first activation of refresh signal AREF will instead refresh a first victim word line (e.g., R+2), and the second activation of refresh signal AREF will refresh a second victim word line (e.g., R−2).

Figure 5:
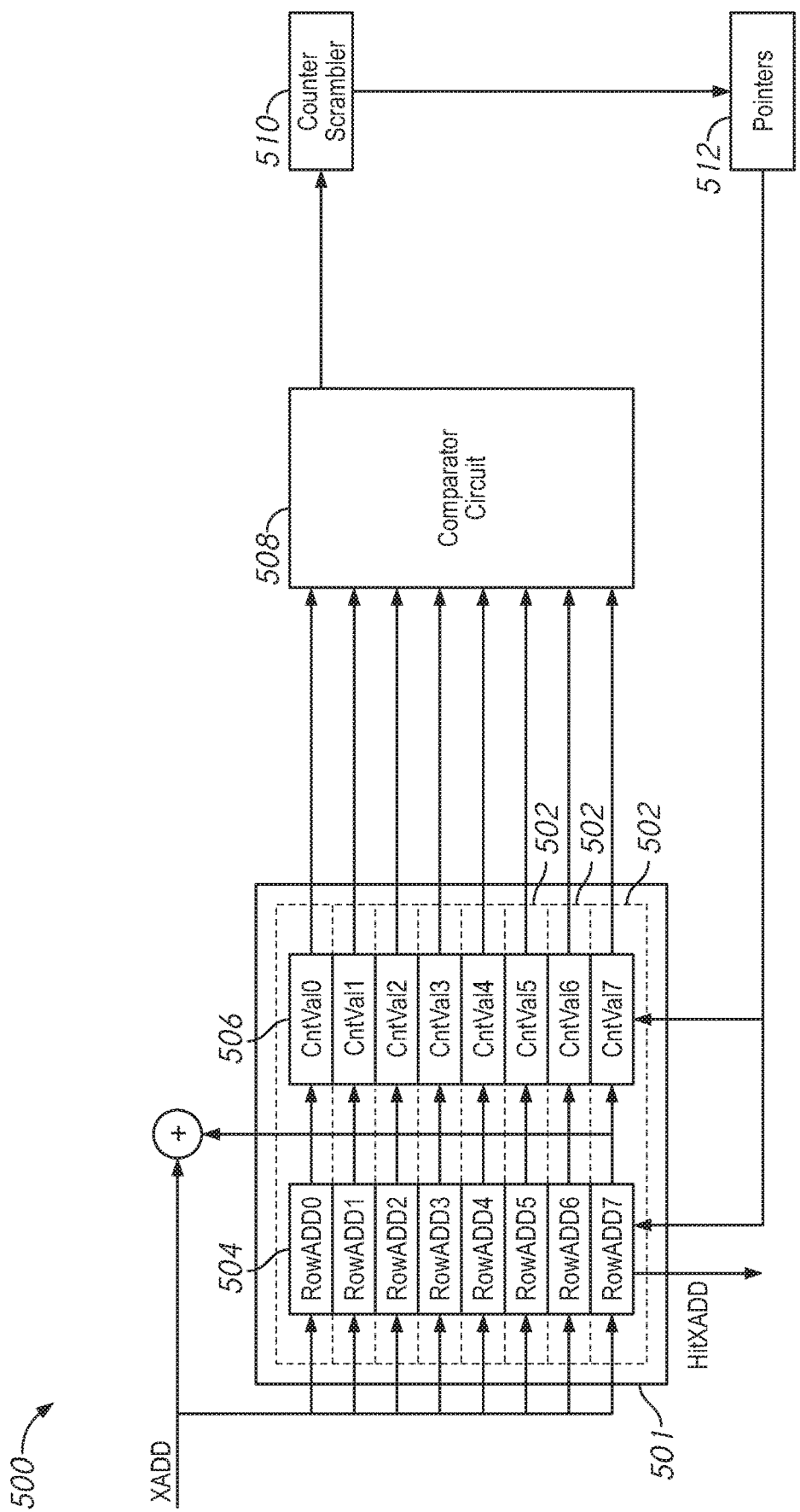
FIG. 5 is an example aggressor row detector circuit according to an embodiment of the present disclosure.

FIG. 5 is an example aggressor row detector circuit 500 according to an embodiment of the present disclosure. In some embodiments, aggressor row detector circuit 500 may be included in aggressor row decoder circuit 230 shown in FIG. 2. However, in other embodiments, other aggressor row detector circuits may be included in aggressor row decoder circuit 230. The aggressor row detector circuit 500 may include a stack 501. The stack 501 may be a content addressable memory (CAM) stack in some embodiments. The stack 501 may include multiple registers (e.g., files) 502, each of which may have corresponding fields 504, 506. In the embodiment shown in FIG. 5, each register includes a field 504 configured to store a row address (RowADD0-7) and a field 506 configured to store a corresponding count value (ACntVal0-7). The fields 506 storing the count values may be coupled to a comparator 508 which may be coupled to pointers 512 through a counter scrambler 510. In some embodiments, the fields 504 storing row addresses may be coupled to one or more victim address generators (not shown in FIG. 5), such first victim address generator 232 and/or second victim address generator 234 shown in FIG. 2, and provide a matched address HitXADD to the victim address generators. While the example in FIG. 5 shows eight registers 502 in the stack 501, it is understood that the stack could include fewer or more registers. For example, the stack 501 could have 128 registers. In another example, the stack 501 could have 1,024 registers.

Each time a row address XADD is provided to the registers 502, the row address XADD may be compared to the fields 504. If the current row address XADD is already stored in one of the registers 502, then the count value in field 506 associated with the matching row address in field 504 may be adjusted (e.g., increased). If the current row address XADD is not already stored in one of the registers 502, it may be added to the registers 502. If there is an open register (e.g., a register without a row address) then the row address XADD may be stored in the open register. If there is not an open register, then the register 502 associated with the count value which has the lowest value (as indicated by the pointers 512) may have its row address replaced with the current row address XADD and count value reset.

The comparator 508 may compare the count values in fields 506 to a threshold value to determine if a count value for a row address has matched or exceeded the threshold value (e.g., 2,000, 3,000, 5,000). In some embodiments, the comparator 508 may further compare the count values to determine which row address is associated with the lowest count value. The fields 506 corresponding to the minimum count value and count values that meet or exceed the threshold value may be provided to a counter scrambler 510, which may match the above threshold value fields and minimum count value field to their respective associated row address fields 504. The pointers 512 may point to the row addresses in fields 504 associated with count values at or above the threshold value and may point to the fields 504 associated with the minimum count value in fields 506. The threshold value pointer(s) may be used to reset the counts of the row addresses determined to be aggressors. In some embodiments, the threshold value pointer(s) may be used to provide the corresponding row address(es) to the victim address generators as HitXADD. The minimum count value pointer may be used to overwrite a register 502 when a new row address XADD is received and there is no open register 502 to store it in.

FIG. 6 is a flow chart 600 of a method according to an embodiment of the present disclosure. At block 602, a step of "providing a first signal having a first frequency" may be performed. In some embodiments, the first signal may be generated by a victim steal rate timing circuit, such as first victim steal rate timing circuit 238 shown in FIG. 2. At block 604, a step of "providing a second signal having a second frequency" may be performed. In some embodiments, the second signal may be generated by a victim steal rate timing circuit, such as second victim steal rate timing circuit 240 shown in FIG. 2. In some embodiments, the second frequency is independent of the first frequency. In some embodiments, the second frequency is different than the first frequency. At block 606, a step of "refreshing a first victim word line" may be performed. In some embodiments, the refreshing may be based, at least in part, on the first frequency. At block 608, a step of "refreshing a second victim word line" may be performed. In some embodiments, the refreshing may be based, at least in part, on the second frequency.

In some embodiments, the method shown in flow chart 600 may further include generating a control signal based, at least in part, on the first signal and the second signal. In some embodiments, the control signal may be generated by a targeted refresh address controller circuit, such as targeted refresh address controller circuit 244 shown in FIG. 2 or targeted refresh address controller circuit 300 shown in FIG. 3. In some embodiments, the method shown in flow chart 600 may further include providing a refresh address for refreshing a word line based, at least in part, on the control signal, wherein the refresh address is the first victim word line or the second victim word line. In some embodiments, the refresh address may be provided by a multiplexer, such as multiplexer 242 shown in FIG. 2 or multiplexer 302 shown in FIG. 3.

The apparatuses and methods described herein may allow for independently controlling the steal rates for different victim word lines, such as victim word lines that have different physical distances from an aggressor word line. In some embodiments, a refresh control circuit may include two or more timing circuits to allow independent control of the steal rates for different victim word lines. This may allow the targeted refresh rates for each type of victim word line to be optimized, which may reduce over-refreshing of the word lines.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a refresh control circuit including:
a first victim steal rate timing circuit configured to provide a first signal at a first frequency, wherein the first frequency indicates a rate a first victim word line is refreshed; and
a second victim steal rate timing circuit configured to provide a second signal at a second frequency, wherein the second frequency indicates a rate a second victim word line is refreshed,
wherein the first frequency and the second frequency are independent of each other.

2. The apparatus of claim 1, wherein the first frequency is greater than the second frequency.

3. The apparatus of claim 2, wherein the first victim word line is physically closer to an aggressor word line than the second victim word line.

4. The apparatus of claim 1, wherein at least one of the first frequency or the second frequency is set by a fuse.

5. The apparatus of claim 1, wherein at least one of the first frequency or the second frequency is set by programming a mode register.

6. The apparatus of claim 1, further comprising a targeted refresh address controller circuit configured to receive the first signal and the second signal, wherein the targeted refresh address controller circuit is configured to provide a control signal based, at least in part on the first signal and the second signal, wherein the control signal determines a row address provided as a refresh address.

7. The apparatus of claim 6, further comprising a multiplexer configured to receive a first victim row address corresponding to the first victim word line and a second victim row address corresponding to the second victim word line, wherein based on the control signal, the multiplexer is configured to provide the first victim row address or the second victim row address as the refresh address.

8. The apparatus of claim 7, wherein the control signal causes the multiplexer to provide the first victim row address when the first signal is active and the control signal causes the multiplexer to provide the second victim row address as the refresh address when the second signal is active.

9. The apparatus of claim 7, wherein the control signal causes the multiplexer to provide the first victim row address as the refresh address when both the first signal and the second signal are active.

10. The apparatus of claim 7, wherein the targeted refresh address controller circuit further receives a refresh signal and the multiplexer further receives an auto-refresh address, wherein the control signal causes the multiplexer to provide the auto-refresh address as the refresh address when the refresh signal is active and the first signal and the second signal are inactive.

11. The apparatus of claim 10, wherein the control signal causes the multiplexer to not provide the refresh address when the refresh signal is inactive.

12. The apparatus of claim 10, wherein the refresh signal is provided by a command control circuit.

13. The apparatus of claim 1, wherein at least one of the first victim steal rate timing circuit or the second victim steal rate timing circuit receives a refresh signal, wherein the refresh signal is configured to synchronize activation of at least one of the first signal and the second signal.

14. An apparatus comprising:
a memory array;
a row control circuit coupled to the memory array;
a first timing circuit configured to provide a first signal at a first frequency;
a second timing circuit configured to provide a second signal at a second frequency, wherein the second frequency is independent of the first frequency; and
a targeted refresh address controller circuit configured to provide a first type of victim row address at the first frequency and a second type of victim row address at the second frequency,
wherein the first type and the second type of victim row addresses are provided to the row control circuit for performing refresh operations on victim word lines of the memory array corresponding to the first type and the second type of victim row addresses.

15. The apparatus of claim 14, further comprising:
an aggressor row detector circuit configured to detect an aggressor word line and provide an aggressor row address corresponding to the aggressor word line;
a first victim address generator configured to provide the first type of victim row address based, at least in part, on the aggressor row address; and
a second victim address generator configured to provide the second type of victim row address based, at least in part, on the aggressor row address.

16. The apparatus of claim 15, wherein a victim word line corresponding to the first type of victim row address has a first physical relationship to the aggressor word line and a victim word line corresponding to the second type of victim row address has a second physical relationship to the aggressor word line different from the first physical relationship.

17. A method comprising:
providing a first signal having a first frequency;
providing a second signal having a second frequency, wherein the second frequency is independent of the first frequency;
refreshing a first victim word line based, at least in part, on the first frequency; and
refreshing a second victim word line based, at least in part, on the second frequency.

18. The method of claim 17, further comprising:
generating a control signal based, at least in part, on the first signal and the second signal; and
providing a refresh address for refreshing a word line based, at least in part, on the control signal, wherein the refresh address is the first victim word line or the second victim word line.

19. The method of claim 17, further comprising setting at least one of the first frequency or the second frequency by setting a fuse.

20. The method of claim 17, further comprising setting at least one of the first frequency or the second frequency by programming a mode register.

* * * * *